(12) United States Patent
Chung et al.

(10) Patent No.: US 10,436,844 B2
(45) Date of Patent: Oct. 8, 2019

(54) SYNTHETIC TEST CIRCUIT FOR TESTING SUBMODULE PERFORMANCE IN POWER COMPENSATOR AND TEST METHOD THEREOF

(71) Applicants: LSIS CO., LTD., Anyang-si, Gyeonggi-do (KR); Pukyong National University Industry-University Cooperation Foundation, Busan (KR)

(72) Inventors: Yong Ho Chung, Anyang-si (KR); Seung Taek Baek, Anyang-si (KR); Young Woo Kim, Anyang-si (KR); Jin Hee Lee, Anyang-si (KR); Eui Cheol Nho, Busan (KR); Jae Hun Jung, Busan (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 150 days.

(21) Appl. No.: 15/683,544

(22) Filed: Aug. 22, 2017

(65) Prior Publication Data

US 2018/0136281 A1    May 17, 2018

(30) Foreign Application Priority Data

Nov. 11, 2016    (KR) .................. 10-2016-0150254

(51) Int. Cl.
*G01R 31/333* (2006.01)
*G01R 31/327* (2006.01)
(Continued)

(52) U.S. Cl.
CPC ..... *G01R 31/3336* (2013.01); *G01R 31/3272* (2013.01); *G01R 31/42* (2013.01);
(Continued)

(58) Field of Classification Search
CPC ............ G01R 31/3336; G01R 31/3272; G01R 31/42; H02J 3/18; H02J 3/12; H02M 3/158; H02M 2007/4835
(Continued)

(56) References Cited

U.S. PATENT DOCUMENTS 3,531,712 A * 9/1970 Cecchini ............... H02M 3/158
307/98
5,376,881 A * 12/1994 Takahashi .............. G01R 31/40
324/511
(Continued)

FOREIGN PATENT DOCUMENTS

EP    0534362 A2 *  3/1993 ............. G01R 31/40
EP    0534362 A2    3/1993
(Continued)

OTHER PUBLICATIONS

Maknouninejad et al., Analysis and Control of PV Inverters Operating in VAR Mode at Night. IEEE. (Year: 2011).*
(Continued)

*Primary Examiner* — Patrick Assouad
*Assistant Examiner* — Sean Curtis
(74) *Attorney, Agent, or Firm* — K&L Gates LLP

(57) ABSTRACT

A synthetic test circuit for testing a submodule performance in a power compensator includes a submodule test unit which is an object of testing the submodule performance, a current source and a controller. The current source is connected to the submodule test unit to supply a voltage to the submodule test unit such that a charging voltage having a capacity set in the submodule test unit is stored in order to operate the submodule test unit. The controller is configured to perform control to perform a submodule performance test of the submodule test unit using the stored charging voltage.

15 Claims, 11 Drawing Sheets

(51) Int. Cl.
*H02J 3/18* (2006.01)
*H02M 3/158* (2006.01)
*G01R 31/42* (2006.01)
*H02M 7/483* (2007.01)

(52) U.S. Cl.
CPC ............... *H02J 3/18* (2013.01); *H02M 3/158* (2013.01); *H02M 2007/4835* (2013.01)

(58) Field of Classification Search
USPC ................ 324/415–424, 684, 750.01, 76.12; 323/356, 370, 242, 288, 326
See application file for complete search history.

(56) References Cited

U.S. PATENT DOCUMENTS

| | | | | |
|---|---|---|---|---|
| 5,663,635 | A * | 9/1997 | Vinciarelli | H02M 3/155 323/224 |
| 5,668,466 | A * | 9/1997 | Vinciarelli | H02M 3/155 323/224 |
| 5,942,880 | A * | 8/1999 | Akamatsu | H02J 3/1807 323/207 |
| 8,154,896 | B2 * | 4/2012 | Angquist | H02J 3/1842 307/77 |
| 8,183,874 | B2 * | 5/2012 | Dommaschk | H02M 7/483 324/658 |
| 8,339,153 | B2 * | 12/2012 | Zha | G01R 31/263 324/762.07 |
| 9,310,421 | B2 * | 4/2016 | Baek | G01R 31/3336 |
| 9,337,645 | B2 * | 5/2016 | Hasler | H02M 1/32 |
| 9,344,010 | B2 * | 5/2016 | Trainer | H02M 7/797 |
| 9,496,787 | B2 * | 11/2016 | Ihs | H02M 3/158 |
| 9,500,696 | B2 * | 11/2016 | Kwon | G01R 31/263 |
| 9,502,978 | B2 * | 11/2016 | Ihs | H02M 3/158 |
| 9,680,392 | B2 * | 6/2017 | Song | H02M 7/49 |
| 9,748,856 | B2 * | 8/2017 | Kim | H02M 5/44 |
| 9,780,682 | B2 * | 10/2017 | Keister | H02M 1/08 |
| 9,853,574 | B2 * | 12/2017 | Oates | H02M 7/797 |
| 9,859,793 | B2 * | 1/2018 | Ihs | H02M 3/156 |
| 9,866,138 | B2 * | 1/2018 | Oates | H02M 1/15 |
| 9,869,728 | B2 * | 1/2018 | Baek | G01R 31/40 |
| 9,966,874 | B2 * | 5/2018 | Wang | H02M 7/483 |
| 9,973,107 | B2 * | 5/2018 | Cerqueira Pinto Bezerra Varajao | H02M 5/297 |
| 10,044,258 | B2 * | 8/2018 | Bryant | H02M 1/34 |
| 10,122,173 | B2 * | 11/2018 | Chung | G01R 21/06 |
| 2006/0043941 | A1 * | 3/2006 | Fujii | H02J 3/1842 323/207 |
| 2011/0222323 | A1 * | 9/2011 | Dofnas | H02M 7/483 363/71 |
| 2015/0102834 | A1 * | 4/2015 | Kwon | G01R 31/263 324/762.01 |
| 2015/0194882 | A1 * | 7/2015 | Ihs | H02M 3/156 323/272 |
| 2015/0200602 | A1 * | 7/2015 | Narimani | H02M 5/4585 363/37 |
| 2015/0288277 | A1 * | 10/2015 | Yan | H02M 3/04 323/234 |
| 2016/0049860 | A1 * | 2/2016 | Ihs | H02M 3/158 323/282 |
| 2016/0049861 | A1 * | 2/2016 | Ihs | H02M 3/158 323/282 |
| 2016/0308360 | A1 * | 10/2016 | Oates | H02M 1/32 |
| 2016/0308466 | A1 * | 10/2016 | Oates | H02M 7/797 |
| 2016/0370437 | A1 * | 12/2016 | Baek | G01R 31/40 |
| 2016/0377687 | A1 * | 12/2016 | Niimura | G01R 31/42 324/750.01 |
| 2017/0201186 | A1 * | 7/2017 | Yuasa | H02M 3/158 |
| 2017/0257022 | A1 * | 9/2017 | Bryant | H02M 1/34 |
| 2017/0269161 | A1 * | 9/2017 | Trainer | G01R 31/3336 |
| 2017/0307688 | A1 * | 10/2017 | Trainer | G01R 31/3336 |
| 2018/0136281 | A1 * | 5/2018 | Chung | G01R 31/3272 |
| 2018/0159328 | A1 * | 6/2018 | Chung | H02J 3/1857 |
| 2018/0233916 | A1 * | 8/2018 | Moreno Munoz | H02M 7/483 |

FOREIGN PATENT DOCUMENTS

| | | | | |
|---|---|---|---|---|
| EP | 0534362 A3 * | 5/1994 | | G01R 31/40 |
| EP | 0534362 B1 * | 6/1996 | | G01R 31/40 |
| EP | 2921871 A1 * | 9/2015 | | G01R 31/42 |
| JP | H0591719 A | 4/1993 | | |
| JP | H11122945 A | 4/1999 | | |
| JP | 2004104891 A | 4/2004 | | |
| JP | 2004524796 | 8/2004 | | |
| JP | 2010093868 A | 4/2010 | | |
| JP | 2016010295 A | 1/2016 | | |
| JP | 2018077211 A * | 5/2018 | | G01R 31/3272 |
| KR | 1020060069253 | 6/2006 | | |
| KR | 100768391 | 10/2007 | | |
| KR | 20160054769 A | 5/2016 | | |
| WO | 2015132960 A1 | 9/2015 | | |
| WO | WO-2016026913 A1 * | 2/2016 | | G01R 31/3336 |
| WO | 2016046047 A1 | 3/2016 | | |
| WO | WO-2016035209 A1 * | 3/2016 | | H02M 3/158 |
| WO | WO-2016046047 A1 * | 3/2016 | | G01R 31/3336 |

OTHER PUBLICATIONS

Japanese Office Action for related Japanese Application No. 2017-153855; action dated Aug. 7, 2018; (3 pages).
Korean Office Action for related Korean Application No. 10-2016-0150254; action dated Jun. 1, 2018; (77 pages).
European Search Report for related European Application No. 17179607.1; report dated Mar. 14, 2018; (10 pages).

* cited by examiner

SYNTHETIC TEST CIRCUIT FOR TESTING SUBMODULE PERFORMANCE IN POWER COMPENSATOR AND TEST METHOD THEREOF

CROSS-REFERENCE TO RELATED APPLICATION

Pursuant to 35 U.S.C. § 119(a), this application claims the benefit of earlier filing date and right of priority to Korean Application No. 10-2016-0150254, filed on Nov. 11, 2016, the contents of which are incorporated by reference herein in its entirety.

BACKGROUND

The present invention relates to a power compensator and, more particularly, to a synthetic test circuit for testing a submodule performance in a power compensator and a test method thereof.

With development of industry and population increase, power consumption has rapidly increased but power generation has some limits.

Therefore, a power system for stably supplying power generated at a generation area to a consumption area without loss has gradually become important.

A necessity of a flexible AC transmission system (FACTS) for improving power flow, system voltage and stability has arisen. A STATic synchronous COMpensator (STATCOM) which is a third-generation power compensator of a FACTS is connected to a power system in parallel to compensate for reactive power and active power necessary for the power system.

FIG. 1 shows a general power supply system.

As shown in FIG. 1, the general power supply system 10 may include a power source 20, a power system 30, a load 40 and a plurality of power compensators 50.

The power source 20 refers to a place or apparatus, in which power is generated, and may be understood as a generator for generating power.

The power system may mean all apparatuses including a power line insulator for transmitting power generated by the power source 20 to the load 40, a steel tower, an arrester and an insulator.

The load 40 means a place or apparatus, in which power generated by the power source 20 is consumed, and may be understood as a consumer for consuming power.

The power compensator 50 is connected to the power system 30 to compensate for reactive power or active power of the power system according to excess or lack of reactive power or active power of the power system 30.

The power compensator 50 includes a plurality of submodules, which are required to be subjected to submodule performance tests.

However, a synthetic test circuit for performing the submodule performance test of the conventional power compensator 50 is very important. However, since technology related to the synthetic test circuit has not been exposed or has not been easily transferred, a synthetic test circuit for testing a submodule performance in a power compensator has not been known up to now.

SUMMARY

An object of the present invention is to solve the above-described problems and other problems.

Another object of the present invention is to provide a synthetic test circuit having a new structure and capable of performing various tests by applying, to a submodule, current and voltage actually generated in the submodule and current and voltage similar thereto when a power compensator normally and abnormally operates, and a test method thereof.

According to an aspect of the present invention, a synthetic test circuit for testing a submodule performance in a power compensator includes a submodule test unit which is a part to be subjected to the submodule performance test, a current source and a controller. The current source may be connected to the submodule test unit to supply a voltage to the submodule test unit such that a charging voltage having a capacity set in the submodule test unit is stored in order to operate the submodule test unit. The controller may be configured to perform control to perform a submodule performance test of the submodule test unit using the stored charging voltage.

According to another aspect of the present invention, a test method of a synthetic test circuit for testing a submodule performance in a power compensator including a submodule test unit which is a part to be subjected to the submodule performance test, a current source connected to the submodule test unit and a test current adjuster connected between the current source and the submodule test unit includes supplying a voltage to the submodule test unit such that a charging voltage having a capacity set in the submodule test unit is stored in order to operate the submodule test unit, operating the submodule test unit using the stored charging voltage, generating test current based on the stored charging voltage upon operation of the submodule test unit, and performing the submodule performance test using the test current.

DETAILED DESCRIPTION OF THE EMBODIMENTS

Figure 1:
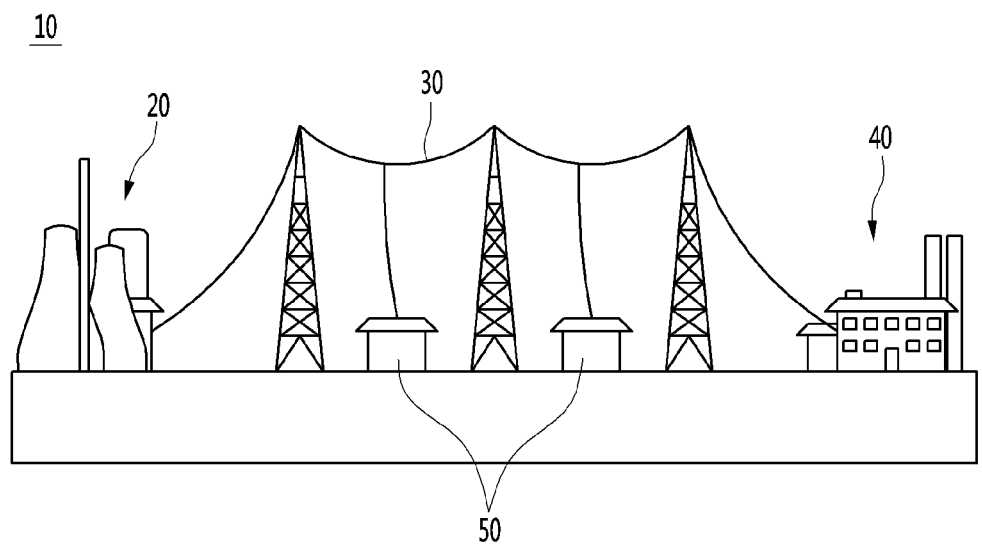
FIG. 1 is a diagram showing a general power supply system.

Hereinafter, the embodiments of the present invention will be described in detail with reference to the accompanying drawings, in which the same or similar portions are denoted by the same reference numerals and repeated descriptions thereof will be omitted. The suffixes "module" and "unit" of elements herein are used for convenience of description and thus can be used interchangeably and do not have any distinguishable meanings or functions. In describing the present invention, a detailed description of known functions and configurations will be omitted when it may obscure the subject matter of the present invention. The accompanying drawings are used to help easily understand the technical idea of the present invention and it should be understood that the idea of the present invention is not limited by the accompanying drawings. The idea of the present invention should be construed to extend to any alterations, equivalents and substitutions besides the accompanying drawings.

Figure 2:
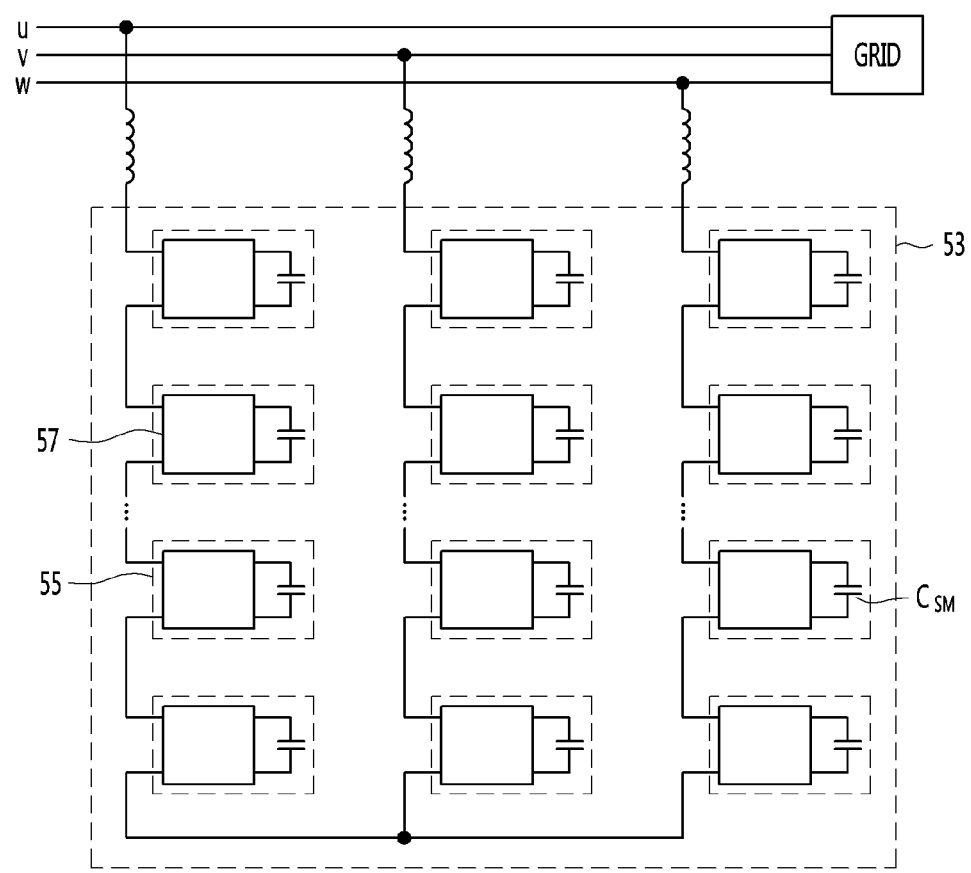
FIG. 2 is a diagram showing a power converter of a modular multilevel converter (MMC) based STATCOM according to the present invention.
Figure 3:
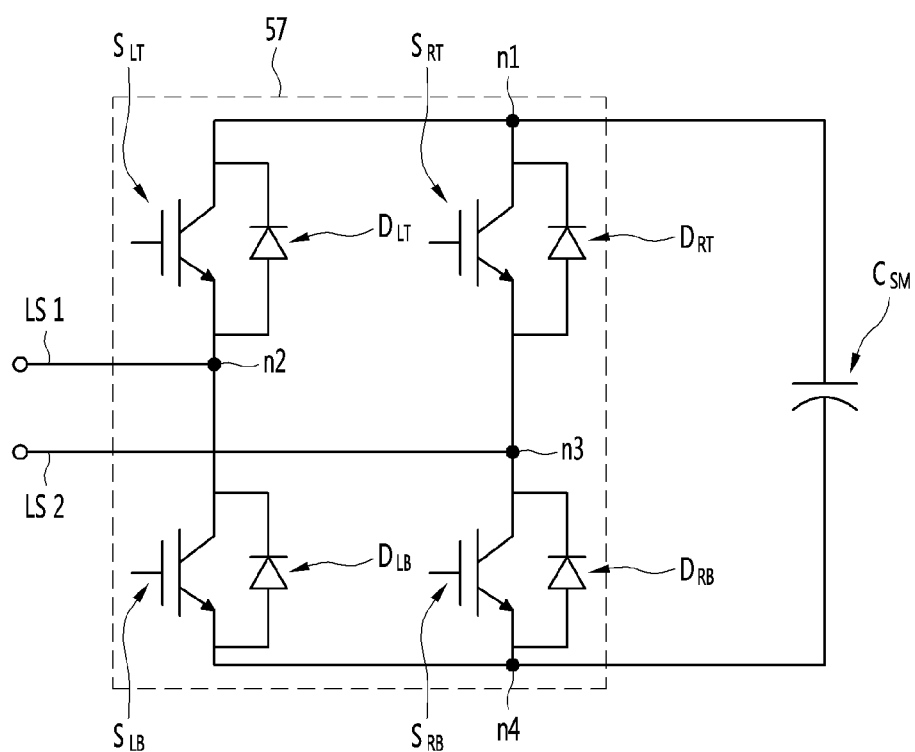
FIG. 3 is a diagram showing a submodule of FIG. 2 in detail.

FIG. 2 is a diagram showing a power converter of a modular multilevel converter (MMC) based STATCOM according to the present invention, and FIG. 3 is a diagram showing a submodule of FIG. 2 in detail.

The STATCOM is a kind of power compensator, to which the present invention is not limited.

As shown in FIG. 2, a power converter 53 of the MMC based STATCOM may include a plurality of submodules 55 connected in series per phase. Reactive power or active power may be supplied to or received from a power system by operation of the plurality of submodules 55.

One phase may be configured by the plurality of submodules connected in series.

The power converter 53 of the MMC based STATCOM may have star connection topology or delta connection topology.

The plurality of submodules 55 included in each phase may be defined as a valve, without being limited thereto.

Each submodule 55 may include a switching unit 57 and a capacitor $C_{SM}$ connected to the switching unit 57.

The plurality of submodules 55 may be connected to each other in series. That is, a first submodule may be connected to a second submodule and the second submodule may be connected to a third submodule. By such a connection method, the submodules may be connected in series up to a last submodule.

A valve of one phase may be configured by the plurality of submodules 55 connected in series and a converter may be configured by first to third valves. The converter is responsible for converting AC power from the power system into DC power or converting DC power stored in the capacitor $C_{SM}$ into AC power. The capacitor $C_{SM}$ may store DC power converted by the converter or supply the stored DC power to the converter.

Accordingly, by operation of the converter including the plurality of submodules 55, reactive power or active power may be supplied to or received from the power system.

A detailed structure of each submodule 55 and a connection structure of each submodule 55 will be described with reference to FIG. 3.

Although FIG. 3 shows the connection structure of a first submodule for convenience of description, the connection structures of the other submodules are equal to that of FIG. 3.

As shown in FIG. 3, the first submodule may include a switching unit 57 and a capacitor $C_{SM}$ connected to the switching unit 57.

The switching unit 57 may include four switches $S_{LT}$, $S_{LB}$, $S_{RT}$ and $S_{RB}$ and four diodes $D_{LT}$, $D_{LB}$, $D_{RT}$ and D respectively connected to the switches $S_{LT}$, $S_{LB}$, $S_{RT}$ and $S_{RB}$ in antiparallel.

The first to fourth switches $S_{LT}$, $S_{LB}$, $S_{RT}$ and $S_{RB}$ may be insulated gate bipolar mode transistors (IGBTs), without being limited thereto.

The first to fourth switches $S_{LT}$, $S_{LB}$, $S_{RT}$ and $S_{RB}$ may be of a full bridge type.

More specifically, the first and second switches $S_{LT}$ and $S_{LB}$ may be connected in series between a first node n1 and a fourth node n4. That is, the first switch $S_{LT}$ may be connected between the first node and a second node n2 and the switch $S_{LB}$ may be connected between the second node n2 and the fourth node n4. Similarly, the first diode $D_{LT}$ may be connected between the first node n1 and the second node n2 and the second diode $D_{LB}$ may be connected between the second node n2 and the fourth node n4.

In addition, the third and fourth switches $S_{RT}$ and $S_{RB}$ may be connected in series between the first node n1 and the fourth node n4. That is, the third switch $S_{RT}$ may be connected between the first node n1 and the third node n3 and the fourth switch $S_{RB}$ may be connected between the third node n3 and the fourth node n4. Similarly, the third diode $D_{RT}$ may be connected between the first node n1 and the third node n3 and the fourth diode $D_{RB}$ may be connected between the third node n2 and the fourth node n4.

A first switch pair including the first and second switches $S_{LT}$ and $S_{LB}$ and a second switch pair including the third and fourth switches $S_{RT}$ and $S_{RB}$ may be connected to each other in parallel between the first and fourth nodes n1 and n4.

A first line LS1 connected to the second node n2 may be connected to a third node n3 of a previous submodule and a second line LS2 connected to the third node n3 may be connected to the second node n2 of a next submodule.

The present invention relates to a synthetic test circuit for testing a submodule performance in the submodule 55 included in the power converter 53 of the MMC based STATCOM as described above and can aid in improving performance of the submodule 55 to suit the STATCOM based on various submodule performance tests of the submodule 55 before the submodule is mounted in the STATCOM.

In general, since the voltage or current generated in the submodule 55 mounted in the STATCOM is very large, it is difficult to manufacture a synthetic test circuit for supplying such voltage or current. In addition, the manufacturing costs of the synthetic test circuit increase.

Accordingly, the present invention provides a synthetic test circuit for testing a submodule performance in a power compensator, which is capable of remarkably reducing energy consumption by reducing the capacity of a test apparatus to the size of a loss component of a subject to be tested while simulating the voltage and current applied to the submodule 55 upon actual operation of the power converter 53 of the MMC based STATCOM.

Figure 4:
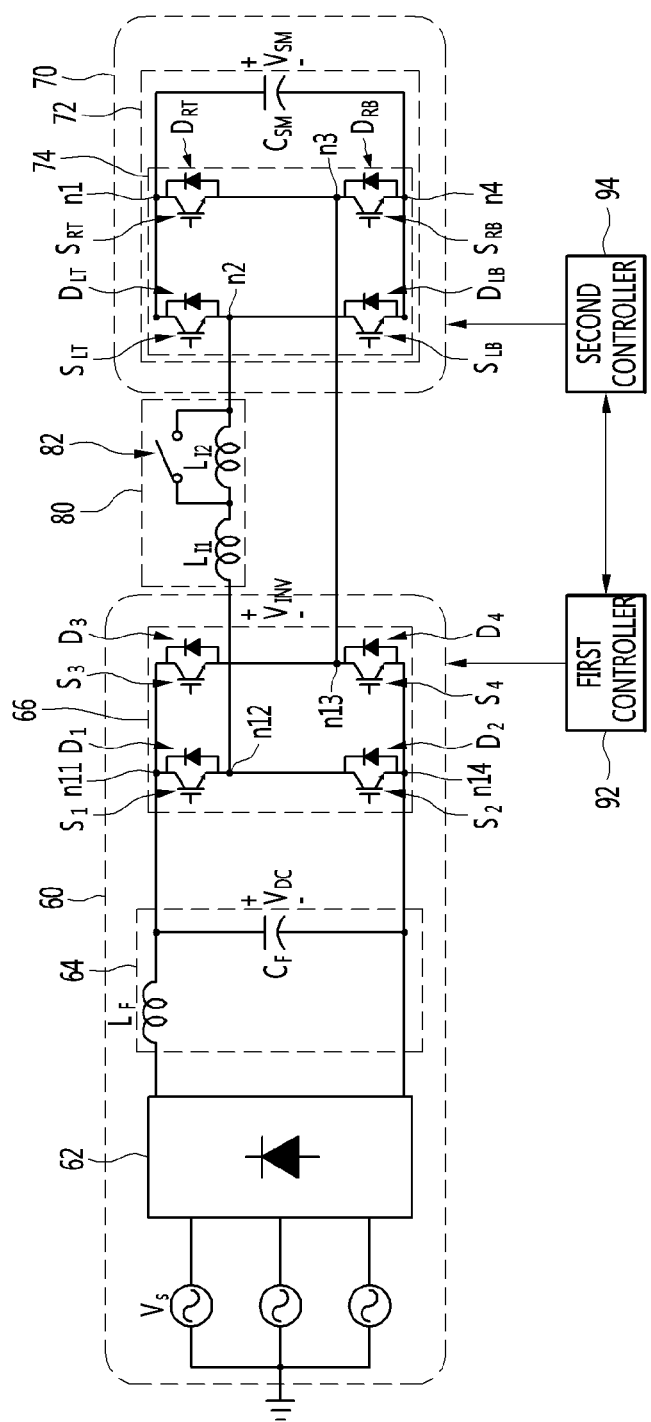
FIG. 4 is a diagram showing a synthetic test circuit for testing a submodule performance in a power compensator according to the present invention.

FIG. 4 is a diagram showing a synthetic test circuit for testing a submodule performance in a power compensator according to the present invention.

Referring to FIG. 4, the synthetic test circuit for testing the submodule performance in the power compensator according to the present invention may include a current source 60, a submodule test unit 70 connected to the current source 60 and a test current adjuster 80 connected between the current source 60 and the submodule test unit 70.

The submodule test unit 70 may be an object of the test of the submodule performance and the current source 60 and the test current adjuster 80 may be a subject of allowing the submodule test unit 70 to be tested.

The current source 60 may be a low-voltage/large-current power supply that supplies a voltage for operating the submodule test unit 70 and supplies a loss compensation component generated in a synthetic test circuit.

The current source 60 may charge a charging voltage $V_{SM}$ on the capacitor $C_{SM}$ of the submodule test unit 70. A charging voltage $V_{SM}$ may be charged to have a capacity set in the capacitor $C_{SM}$. By this charging voltage $V_{SM}$, the test of the submodule performance of the power compensator may be consistently performed.

When the capacitor $C_{SM}$ is charged as the predetermined capacity, the submodule 72 of the submodule test unit 70 or the other component (not shown) may operate by the charging voltage $V_{SM}$ of the capacitor $C_{SM}$.

The output voltage $V_{INV}$ of the current source 60 may be significantly less than the charging voltage $V_{SM}$ of the capacitor $C_{SM}$ of the submodule test unit 70. For example, the output voltage $V_{INV}$ of the current source 60 may be, for example, 25 V, while the charging voltage $V_{SM}$ of the capacitor $C_{SM}$ of the submodule test unit 70 may be 3 kV to 3.6 kV (in the case in which three submodules are connected in series).

Accordingly, once the capacitor $C_{SM}$ of each submodule of the submodule test unit 70 is charged, although the current source 60 does not supply a voltage during the test of the submodule performance of the submodule test unit 70, it is possible to easily perform the submodule performance test without substantial power consumption.

If desired test current is not generated due to loss during the test of the submodule performance of the submodule test unit 70, power loss may be intermittently compensated for by the current source 60, which will be described below in detail with reference to FIGS. 9 and 10.

The current source 60 may include a rectifier 62, a ripple remover 64 and a loss compensator 66.

The rectifier 62 may be a diode type rectifier for rectifying three-phase AC voltage $V_S$ into a low DC voltage $V_{DC}$.

For example, the DC voltage $V_{DC}$ may be 50 V, without being limited thereto.

Ripple included in the DC voltage $V_{DC}$ may be removed by the ripple remover 64. The ripple remover 64 may include an inductor $L_F$ connected to the rectifier 62 and a capacitor $C_F$ connected to the inductor $L_F$ in parallel.

The DC voltage $V_{DC}$ is applied across the capacitor $C_F$.

The loss compensator 66 may be an inverter for converting the DC voltage $V_{DC}$ into the output voltage $V_{INV}$. More specifically, the loss compensator 66 may output the output voltage $V_{INV}$ converted from the DC voltage $V_{DC}$ in order to compensate for loss when loss is generated while test current generated upon the test of the submodule performance of the submodule test unit 70 flows.

The loss compensator 66 may include four switches S1 to S4 and four diodes D1 to D4 respectively connected to the switches S1 to S4 in antiparallel.

The first to fourth switches S1 to S4 may be insulated gate bipolar mode transistors (IGBTs), without being limited thereto.

The first to fourth switches S1 to S4 may be of a full bridge type.

More specifically, the first and second switches S1 and S2 may be connected in series between a first node n11 and a fourth node n14. That is, the first switch S1 may be connected between the first node n11 and a second node n12 and the second switch S2 may be connected between the second node n12 and the fourth node n14. Similarly, the first diode D1 may be connected between the first node n11 and the second node n12 and the second node D2 may be connected between the second node n12 and the fourth node n14.

In addition, the third and fourth switches S3 and S4 may be connected in series between the first node n11 and the fourth node n14. That is, the third switch S3 may be connected between the first node n11 and a third node n13 and the fourth switch S4 may be connected between the third node n13 and the fourth node n14. Similarly, the third diode D3 may be connected between the first node n11 and the third node n13 and the fourth diode D4 may be connected between the third node n13 and the fourth node n14.

A first switch pair including the first and second switches S1 and S2 and a second switch pair including the third and fourth switches S3 and S4 may be connected to each other in parallel between the first and fourth nodes n11 and n14.

The first to fourth switches S1, S2, S3 and S4 of the loss compensator 66 may be switched by a first controller 92.

The loss compensator 66 may switch the first to fourth switches S1, S2, S3 and S4 using the first controller 92, convert the DC voltage $V_{DC}$ output from the rectifier 62 into the output voltage $V_{INV}$ and output the output voltage $V_{INV}$, in order to compensate for loss generated while test current flows. This will be described below in detail with reference to FIGS. 9 and 10.

The test current adjuster 80 may adjust test current for a test of submodule performance of the submodule test unit 70.

In addition, when the current source 60 supplies the DC voltage $V_{DC}$ or the output voltage $V_{INV}$ to the submodule test unit 70 to perform the submodule performance test of the submodule test unit 70, the capacitor $C_{SM}$ of the submodule test unit 70 may be charged using the DC voltage $V_{DC}$ or the output voltage $V_{INV}$. The test current adjuster 80 may adjust charging current that flows according to the charging voltage $V_{SM}$ charged on the capacitor $C_{SM}$ of the submodule test unit 70.

The test current adjuster 80 may include a first inductor $L_{f1}$, a second inductor $L_{f2}$ and a switch 82 in order to adjust test current.

The first inductor $L_{f1}$ and the second inductor $L_{f2}$ may or may not have the same inductance.

The switch 82 may be connected to input/output terminals of the second inductor $L_{f2}$ in parallel. For example, when the switch 82 is opened, test current may be adjusted according to first inductance of the first inductor $L_{f1}$ and second inductance of the second inductor $L_{f2}$. For example, when the switch 82 is closed, since current flowing through the first inductor $L_{f1}$ is bypassed through the switch 82 without passing through the second inductor $L_{f2}$, test current may be adjusted according to the first inductance of the first inductor $L_{f1}$.

Accordingly, the test current may be differently adjusted by opening or closing the switch 82.

For example, according to the international standard (IEC 62927: Voltage sourced converter (VSC) valves for static synchronous compensator (STATCOM)—Electrical Testing), a test of a submodule performance of a rated voltage and a low voltage may be specified.

For example, upon the test of the submodule performance of the rated voltage, the switch 82 may be opened to use both the first and second inductors $L_{f1}$ and $L_{f2}$ to adjust test current. For example, upon the test of the submodule performance of the low voltage, the switch 82 may be closed to use only the first inductor $L_{f1}$ to adjust test current.

The switch 82 may be controlled by any one of the first and second controllers 92 and 94.

The submodule test unit 70 may include a submodule 72. The submodule 72 may include a switching unit 74 and the capacitor $C_{SM}$ connected to the switching unit 74.

The submodule 72 included in the submodule test unit 70 may be connected to the test current adjuster 80 connected to the current source 60, for the test of the submodule performance, before being mounted in a power converter 53, as the submodule 55 actually mounted in the power converter 53 of the power compensator, that is, the MMC based STATCOM.

The submodule 72 has the same structure as the submodule 55 included in the power converter 53 of the MMC based STATCOM shown in FIG. 3 and thus a detailed description thereof will be omitted.

As described above, the power converter 53 of the MMC based STATCOM may include the plurality of submodules 55. However, it is physically impossible to perform the submodule performance test with respect to all submodules 55.

According to the international standard (IEC 62927: Voltage sourced converter (VSC) valves for static synchronous compensator (STATCOM)—Electrical Testing), it is specified that at least three IGBT switches connected in series are tested.

Figure 5:
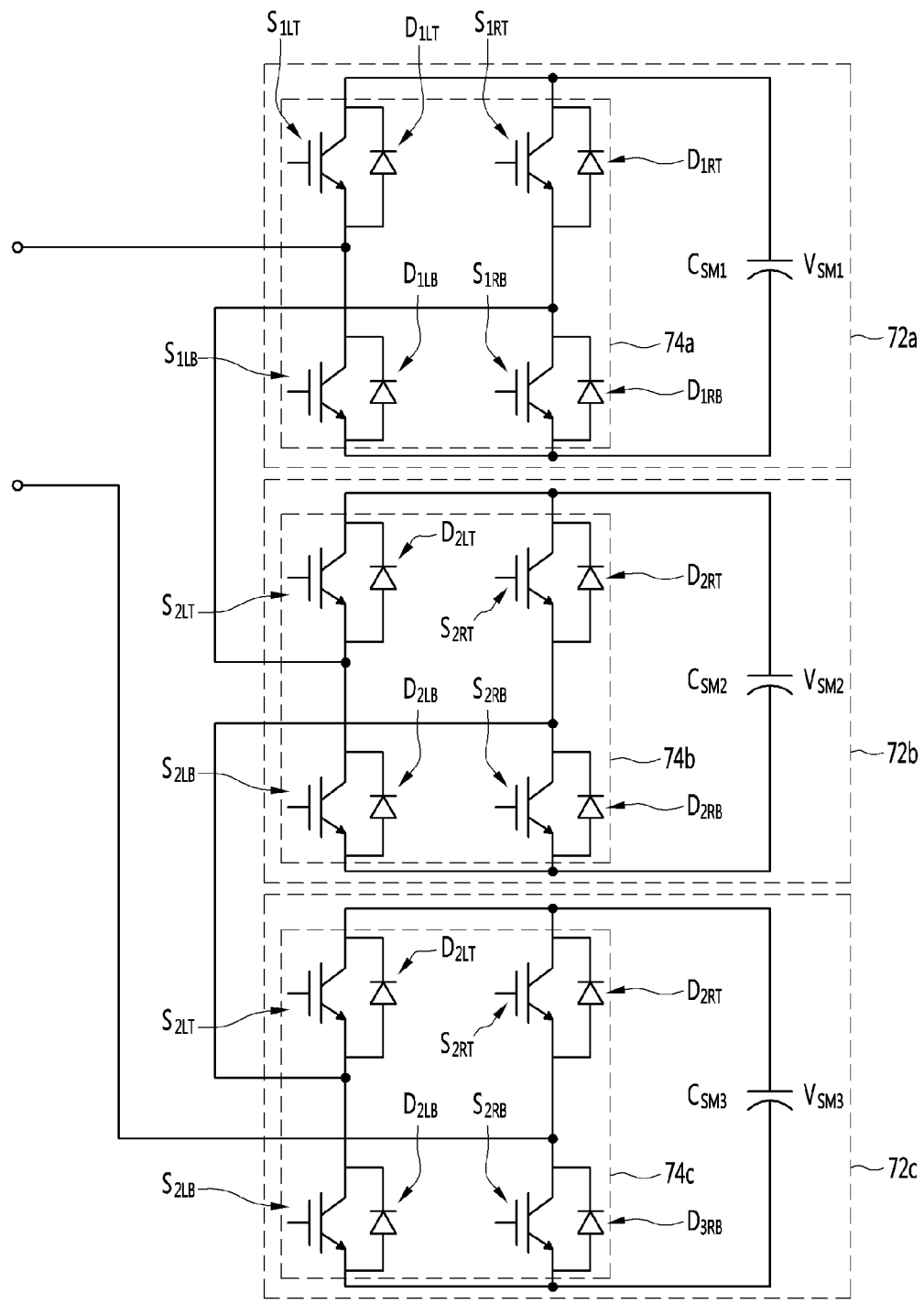
FIG. 5 is a diagram showing the structure of a submodule testing unit of FIG. 4 in detail.

As shown in FIG. 5, the submodule 72 connected to the current source 60 may include three submodules 72a, 72b and 72c connected in series, for the test of the submodule performance, without being limited thereto.

The submodules 72a, 72b and 72c may include a plurality of switching units 74a, 74b and 74c and capacitors $C_{SM1}$, $C_{SM2}$ and $C_{SM3}$ connected to the switching units 74a, 74b and 74c. At this time, the switching units 74a, 74b and 74c may be connected to each other in series.

The submodule test unit 70 may charge the capacitor $C_{SM}$ with the output voltage $V_{INV}$ supplied by the current source 60 during an initial test of the submodule performance. Thereafter, since test current for the test of the submodule performance is generated using the charging voltage $V_{SM}$ of the capacitor $C_{SM}$, the capacitor $C_{SM}$ does not need to be charged with the output voltage $V_{INV}$ from the current source 60 during the test of the submodule performance.

If loss is generated in test current while test current flows, the output voltage $V_{INV}$ from the loss compensator 66 of the current source 60 may be intermittently supplied to the submodule test unit 70 in order to compensate for such loss.

The submodule test unit 70 and, more specifically, the first to fourth switches $S_{LT}$, $S_{LB}$, $S_{RT}$ and $S_{RB}$ of the submodule 72 may be controlled by the second controller 94.

For the test of the submodule performance, the submodule test unit 70 may operate such that test current may be continuously generated for 30 minutes or more, for example. Test current has an AC waveform in a period. If loss is generated in test current having the AC waveform during the test of the submodule performance, loss may be compensated for by a loss compensation component (the output voltage $V_{INV}$ of a specific period, see FIG. 10) provided by the current source 60, thereby continuously performing the submodule performance test of the rated voltage or the low voltage without error.

Although the first and second controller 92 and 94 are separately described in FIG. 4 for convenience of description, the first and second controllers 92 and 94 may be combined into one controller.

If the first and second controllers 92 and 94 are individually used, the first and second controllers 92 and 94 may communicate with each other to exchange related information.

For example, when the first controller 92 requests switching control of the first to fourth switches $S_{LT}$, $S_{LB}$, $S_{RT}$ and $S_{RB}$ of the submodule test unit 70 to the second controller 94 in order to charge the capacitor $C_{SM}$ of the submodule 72 of the submodule test unit 70 upon the test of the submodule performance, the second controller 94 may control switching of the first to fourth switches $S_{LT}$, $S_{LB}$, $S_{RT}$ and $S_{RB}$ of the submodule test unit 70 in response to the request.

For example, the first to fourth switches $S_{LT}$, $S_{LB}$, $S_{RT}$ and $S_{RB}$ of the submodule 72 may be switched under control of the second controller 94 to generate test current for the test of the submodule performance, such that test current may flow in the current source 60, the test current adjuster 80 and the submodule test unit 70. At this time, if it is detected that loss is generated in test current by the second controller 94, the second controller 94 may request loss compensation to the first controller 92 and the first controller 92 may control the first to fourth switches $S_{LT}$, $S_{LB}$, $S_{RT}$ and $S_{RB}$ of the loss compensator 66 of the current source 60 to compensate for loss in response to the loss compensation request.

<Generation of Test Current for Submodule Performance Test>

A method of generating test current for a submodule performance test will be described with reference to FIGS. 6 to 8F.

Figure 6:
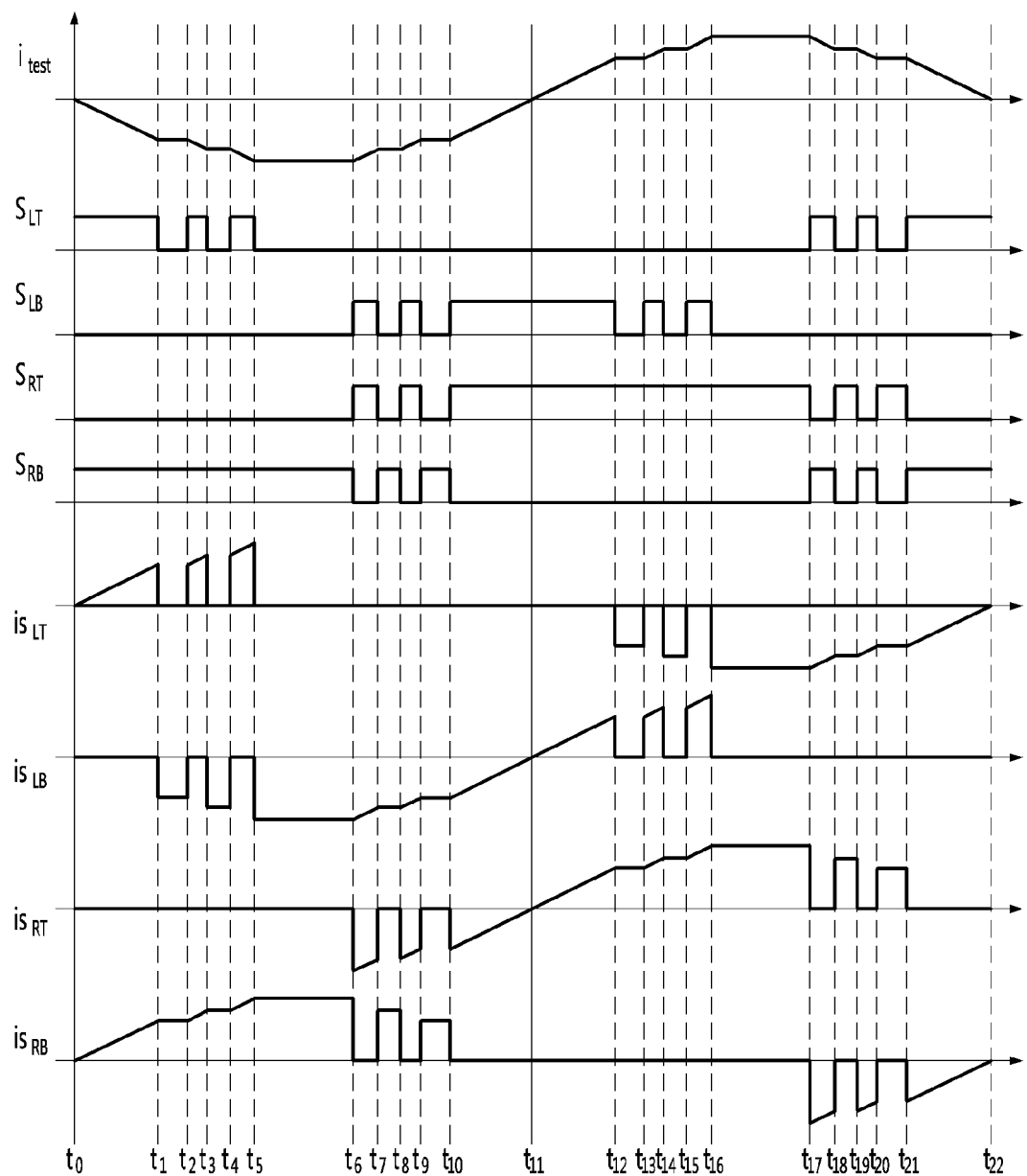
FIG. 6 is a waveform diagram of testing a submodule performance in a power compensator according to the present invention.
Figure 7:
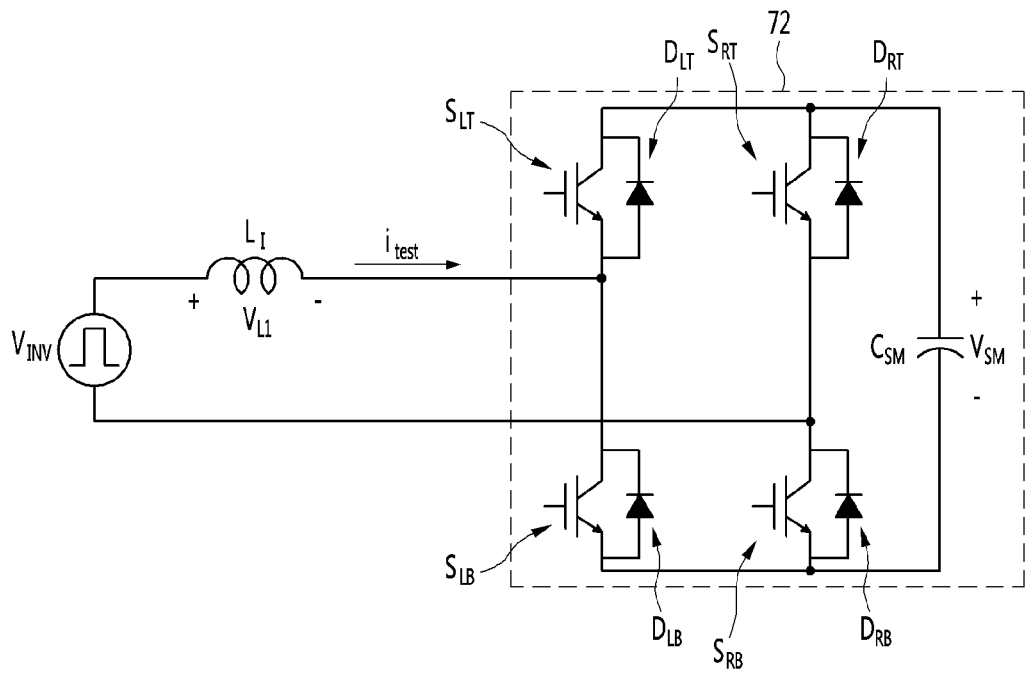
FIG. 7 is a diagram showing an equivalent circuit for generating test current in a synthetic test circuit for testing a submodule performance in a power compensator according to the present invention.

FIG. 6 is a waveform diagram of a submodule performance test of a power compensator according to the present invention. FIG. 7 is a diagram showing an equivalent circuit for generating test current in a synthetic test circuit for testing a submodule performance in a power compensator according to the present invention. FIGS. 8A to 8F are diagrams showing flow of test current according to each mode in the equivalent circuit for generating test current.

For a test of a submodule performance, the capacitor $C_{SM}$ of the submodule test unit 70 may be charged with the DC voltage $V_{DC}$ or the output voltage $V_{INV}$ output from the current source 60.

As shown in FIG. 7, the test current adjuster 80 may generate test current $i_{test}$ using the output voltage $V_{INV}$ output from the current source 60 and the charging voltage $V_{SM}$ of the capacitor $C_{SM}$ of the submodule test unit 70 and by controlling switching of the first to fourth switches $S_{LT}$, $S_{LB}$, $S_{RT}$ and $S_{RB}$ of the submodule test unit 70. The test current $i_{test}$ may flow in a negative (−) direction or a positive (+) direction by controlling switching of first to fourth switches $S_{LT}$, $S_{LB}$, $S_{RT}$ and $S_{RB}$ of the submodule test unit 70.

Here, the negative (−) direction refers to a direction from the right side to the left side of the test current adjuster 80 and the positive (+) direction refers to a direction from the left side to the right side of the test current adjuster 80. Alternatively, a forward direction and a backward direction may be reversely defined. When the test current $i_{test}$ flows in the negative (−) direction, the test current $i_{test}$ may have a negative value and, when the test current $i_{test}$ flows in the positive (+) direction, the test current $i_{test}$ may have a positive value.

The negative (−) direction and the positive (+) direction may be reversely defined without being limited thereto.

When the capacitor $C_{SM}$ is charged, as described above, since the charging voltage $V_{SM}$ of the capacitor $C_{SM}$ is remarkably higher than the output voltage $V_{INV}$ output from the current source 60, the output voltage $V_{INV}$ may be regarded as 0 V.

For convenience of description, upon generating the test current $i_{test}$ for the test of the submodule performance, the output voltage $V_{INV}$ may be regarded as 0 V and thus the output voltage $V_{INV}$ may be ignored. Thus, the test current $i_{test}$ may be generated by the charging voltage of the capacitor $C_{SM}$.

In the present invention, switching of the first to fourth switches $S_{LT}$, $S_{LB}$, $S_{RT}$ and $S_{RB}$ of the submodule test unit 70 may be controlled in mode 1 to mode 2 as shown in Table 1 below.

TABLE 1

| Mode | Period |
|---|---|
| Mode 1 | t0 ≤ t < t1 |
| Mode 2 | t1 ≤ t < t2 |
| Mode 3 | t2 ≤ t < t3 |
| Mode 4 | t3 ≤ t < t4 |
| Mode 5 | t4 ≤ t < t5 |
| Mode 6 | t5 ≤ t < t6 |
| Mode 7 | t6 ≤ t < t7 |
| Mode 8 | t7 ≤ t < t8 |
| Mode 9 | t8 ≤ t < t9 |
| Mode 10 | t9 ≤ t < t10 |
| Mode 11 | t10 ≤ t < t11 |
| Mode 12 | t11 ≤ t < t12 |
| Mode 13 | t12 ≤ t < t13 |
| Mode 14 | t13 ≤ t < t14 |
| Mode 15 | t14 ≤ t < t15 |
| Mode 16 | t15 ≤ t < t16 |
| Mode 17 | t16 ≤ t < t17 |
| Mode 18 | t17 ≤ t < t18 |
| Mode 19 | t18 ≤ t < t19 |
| Mode 20 | t19 ≤ t < t20 |
| Mode 21 | t20 ≤ t < t21 |
| Mode 22 | t21 ≤ t < t22 |

Hereinafter, operation of each mode will be described.

Figure 8A:
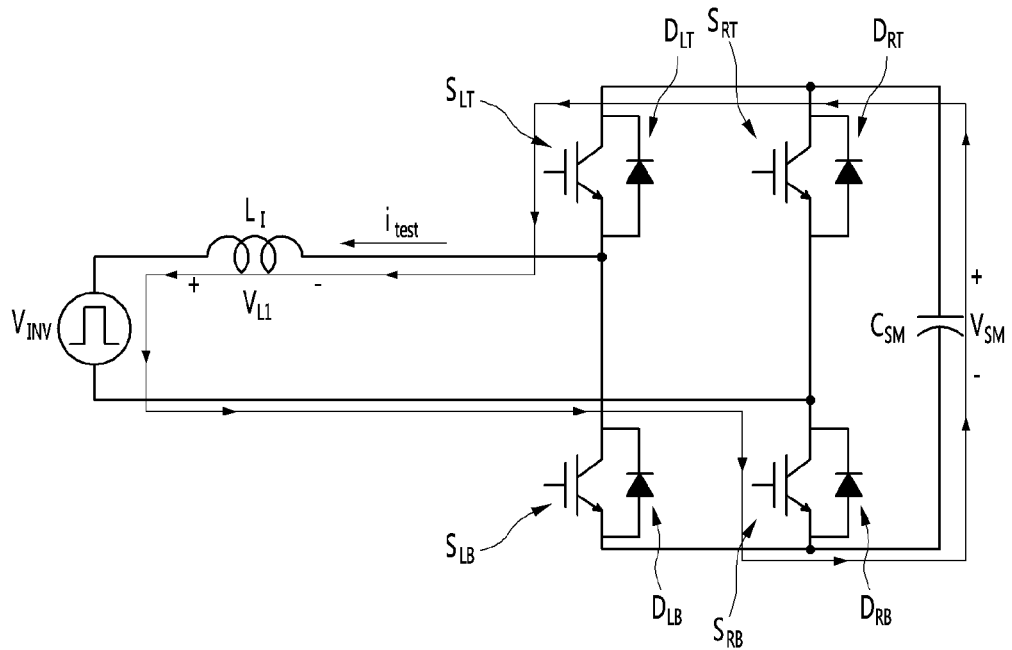
FIGS. 8A to 8F are diagrams showing flow of test current according to each mode in the equivalent circuit for generating test current.
Figure 8B:
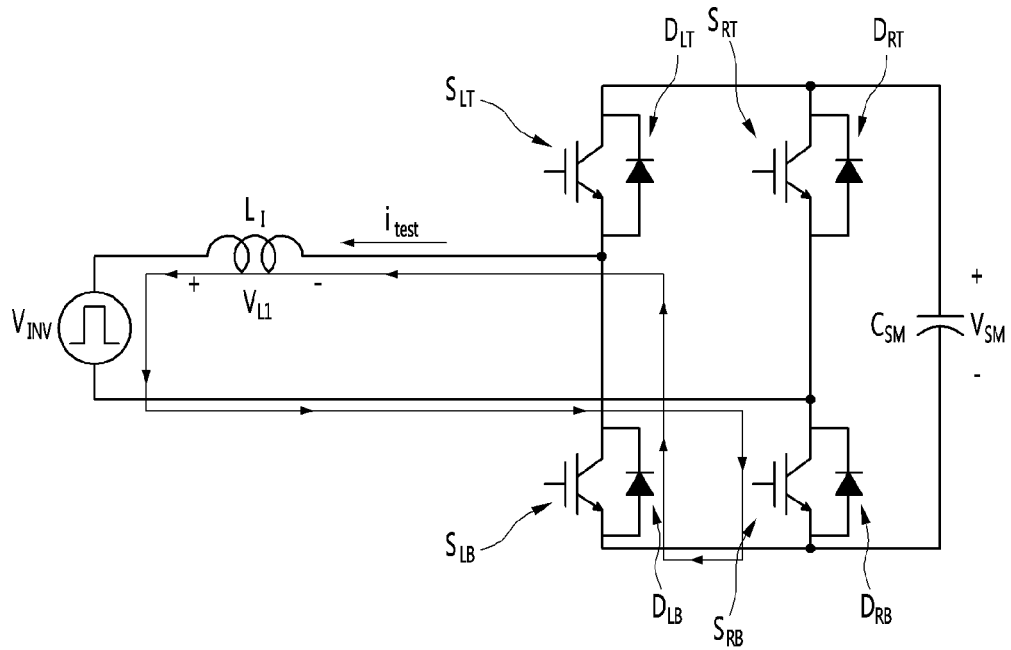
Figure 8C:
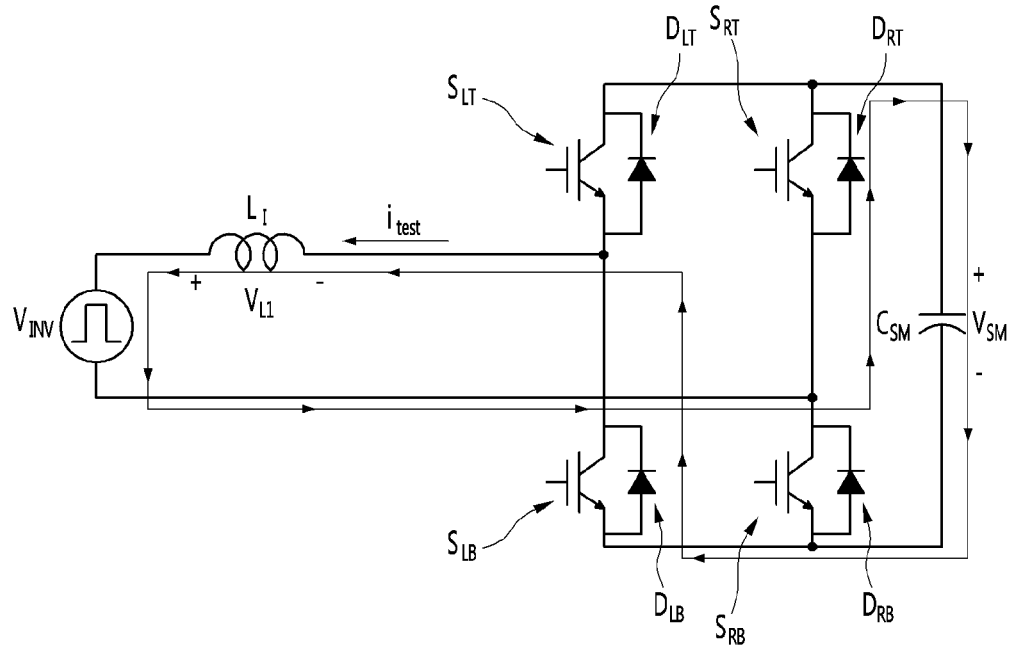
Figure 8D:
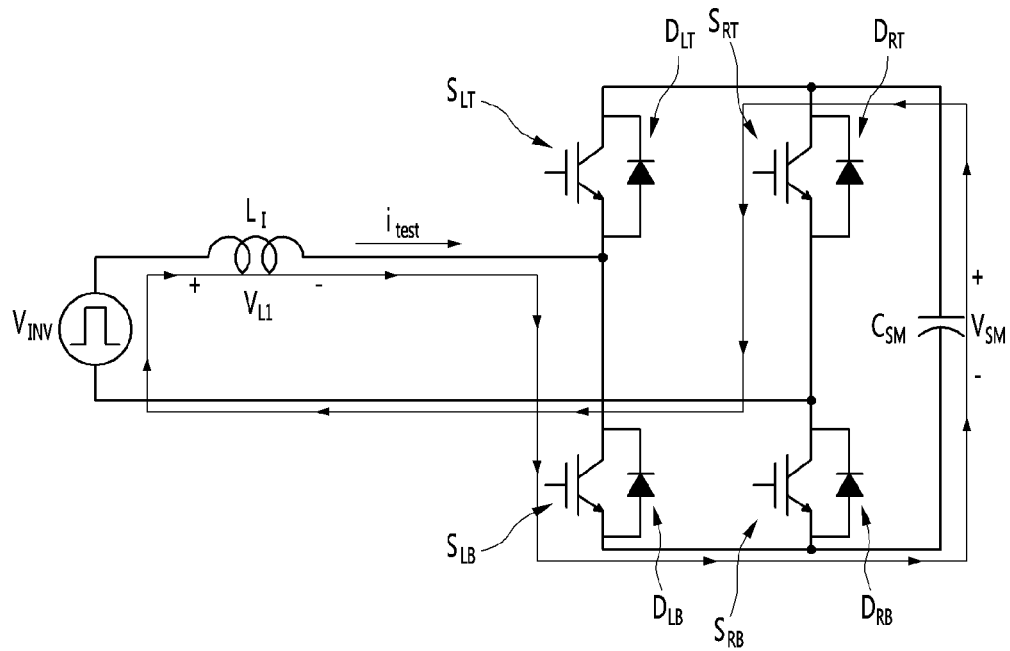
Figure 8E:
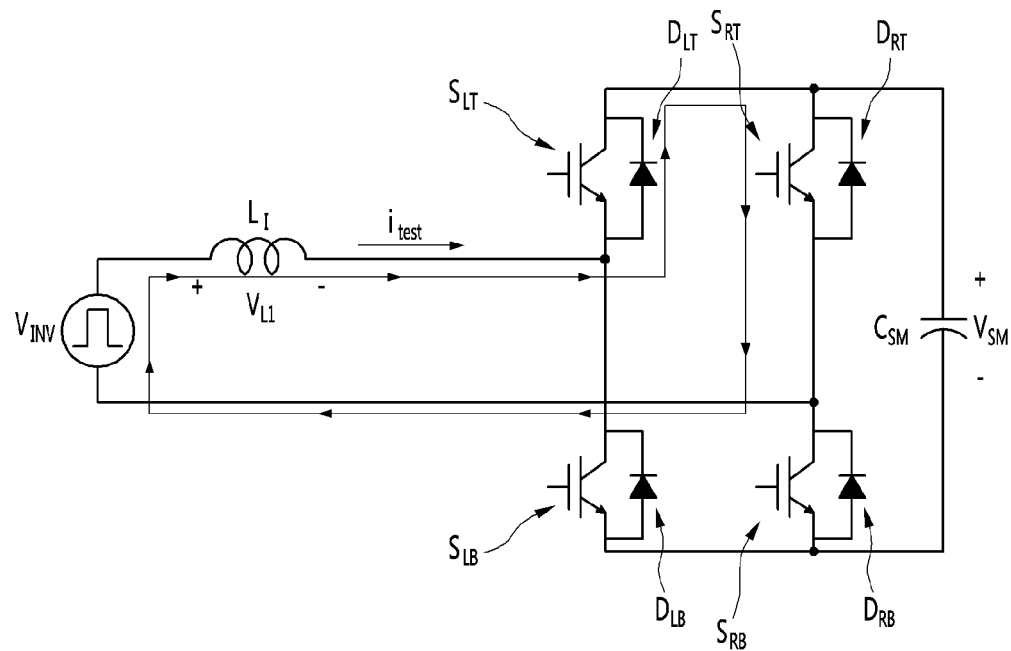
Figure 8F:
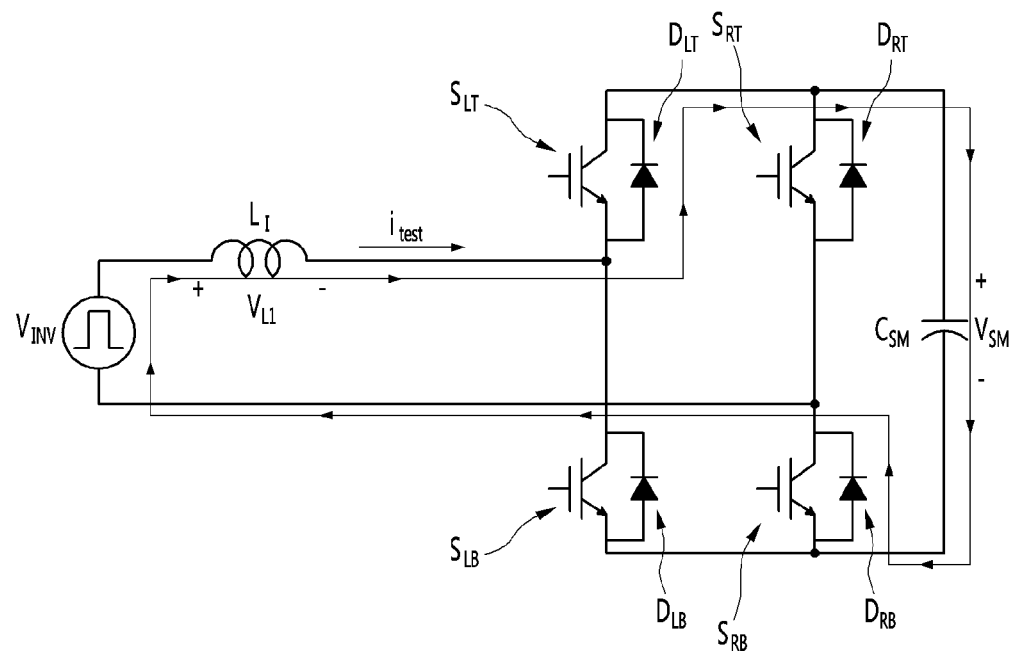

FIG. 8A is applicable to Mode 1, Mode 3 and Mode 5. FIG. 8B is applicable to Mode 2, Mode 4, Mode 6, Mode 8 and Mode 10. FIG. 8C is applicable to Mode 7, Mode 9 and Mode 11. FIG. 8D is applicable to Mode 12, Mode 14 and Mode 16. FIG. 8E is applicable to Mode 13, Mode 15, Mode 17, Mode 19 and Mode 21. FIG. 8F is applicable to Mode 18, Mode 20 and Mode 22.

The width of the period of each mode may be changed according to optimization of the test of the submodule performance. In addition, although 22 modes are described in the present invention, the number of modes may be changed according to optimization of the submodule test.

In the following description, assume that the output voltage $V_{INV}$ of the current source 60 is regarded as 0 V and a submodule performance test is performed under a rated voltage environment. In this case, the inductance of the inductor $L_I$ of the test current adjuster 80 may be expressed as follows.

$$L_1 = L_{I1} + L_{I2} \qquad \text{Equation 1}$$

where, $L_{I1}$ denotes a first inductor and $L_{I2}$ denotes a second inductor.

In addition, the charging voltage $V_{SM}$ of the capacitor $C_{SM}$ of the submodule 72 may be expressed as follows.

$$V_{SM} = V_{SM1} + V_{SM2} + V_{SM3} \qquad \text{Equation 2}$$

where, $V_{SM1}$ denotes the charging voltage of the capacitor $C_{SM1}$ of the first submodule 72a, $V_{SM2}$ denotes the charging voltage of the capacitor $C_{SM2}$ of the second submodule 72b, and $V_{SM3}$ denotes the charging voltage of the capacitor $C_{SM3}$ of the third submodule 72c (see FIG. 5).

In addition, all components shown in FIG. 7, that is, the switches $S_{LT}$, $S_{LB}$, $S_{RT}$ and $S_{RB}$, the diodes $D_{LT}$, $D_{LB}$, $D_{RT}$ and $D_{RB}$, the capacitor $C_{SM}$ and the inductor $L_I$, may be regarded as being ideal.

Mode 1 (t0 ≤ t < t1)

In Mode 1, as shown in FIG. 6, the first switch $S_{LT}$ and the fourth switch $S_{RB}$ of the submodule 72 may be turned on and the second switch $S_{LB}$ and the third switch $S_{RT}$ may be turned off. In this case, currents $i_{SLT}$ and $i_{SRB}$ may flow through the first switch $S_{LT}$ and the fourth switch $S_{LB}$. As a result, as shown in FIG. 8A, the test current $i_{test}$ may flow through the capacitor $C_{SM}$, the first switch $S_{LT}$, the inductor $L_I$ and the fourth switch $S_{RB}$. At this time, the test current $i_{test}$ increases with lapse of time as follows.

$$i_{test} = (-V_{SM})/L_I \times t \qquad \text{Equation 3}$$

Accordingly, the test current $i_{test}$ may decrease according to Equation 3. Such test current $i_{test}$ may increase until the first switch $S_{LT}$ or the fourth switch $S_{RB}$ is turned off.

Mode 2 (t1 ≤ t < t2)

In Mode 2, as shown in FIG. 6, only the fourth switch $S_{RB}$ may be turned on and the remaining switches, that is, the first to third switches $S_{LT}$, $S_{LB}$ and $S_{RT}$ may be turned off. In this case, since the charging voltage $V_{SM}$ of the capacitor $C_{SM}$ is no longer applied to the inductor $L_I$, the test current $i_{test}$ no longer increases. That is, the voltage applied to the inductor $L_I$ is 0 (zero). At this time, the test current $i_{test}$ flows through the second diode $D_{LB}$, the inductor $L_I$ and the fourth switch $S_{RB}$ as shown in FIG. 8B. Accordingly, the test current $i_{test}$ may be expressed as follows.

$$i_{test} = i_{test}(t_1) = i_{test}(t_2) \qquad \text{Equation 4}$$

Accordingly, according to Equation 4, the test current $i_{test}$ may be equally maintained at a first time t1 and a second time t2. Therefore, it can be seen that the test current $i_{test}$ of Mode 2 is equal to the test current $i_{test}(t_1)$ of the end time t1 of Mode 1.

Mode 3 (t2 ≤ t < t3)

In Mode 3, as shown in FIG. 6, the fourth switch $S_{RB}$ may be maintained in the ON state and the first switch $S_{LT}$ may be turned on again. In this case, the charging voltage $V_{SM}$ of the capacitor $C_{SM}$ may be turned on again. In this case, the charging voltage $V_{SM}$ of the capacitor $C_{SM}$ may be applied to the inductor $L_I$ through the first switch $S_{LT}$.

Equally to Mode 1, the test current $i_{test}$ may decrease. That is, as shown in FIG. 8A, the test current $i_{test}$ flows through the capacitor $C_{SM}$, the first switch $S_{LT}$, the inductor $L_I$ and the fourth switch $S_{RB}$. At this time, the test current $i_{test}$ increases with lapse of time as follows.

$$i_{test} = i_{test}(t2) + (-V_{SM})/L_I \times t \qquad \text{Equation 5}$$

Accordingly, according to Equation 5, the test current $i_{test}$ may decrease from the test current value $i_{test}(t_2)$ of the end time t2 of Mode 2.

Mode 4 (t3 ≤ t < t4)

In Mode 4, as shown in FIG. 6, the fourth switch $S_{RB}$ may be maintained in the ON state and the first switch $S_{LT}$ may be turned off again. In this case, since the charging voltage $V_{SM}$ of the capacitor $C_{SM}$ cannot be applied to the inductor $L_I$ through the first switch $S_{LT}$, the test current $i_{test}$ does not increase. That is, the voltage applied to the inductor $L_I$ is 0 (zero).

The test current $i_{test}$ flows through the second diode $D_{LB}$, the inductor $L_I$ and the fourth switch $S_{RB}$ as shown in FIG. 8B. Accordingly, the test current $i_{test}$ may be expressed as follows.

$$i_{test} = i_{test}(t_3) = i_{test}(t_4) \qquad \text{Equation 6}$$

Accordingly, according to Equation 6, the test current $i_{test}$ may be equally maintained at a third time t3 and a fourth time t4. Therefore, it can be seen that the test current $i_{test}$ of Mode 4 is equal to the test current $i_{test}(t_3)$ of the end time t3 of Mode 3.

Mode 5 (t4≤t<t5)

In Mode 5, as shown in FIG. 6, the fourth switch $S_{RB}$ may be maintained in the ON state and the first switch $S_{LT}$ may be turned on again. In this case, the charging voltage $V_{SM}$ of the capacitor $C_{SM}$ may be applied to the inductor $L_I$ through the first switch $S_{LT}$.

Therefore, equally to Modes 1 and 3, the test current $i_{test}$ may decrease. That is, as shown in FIG. 8A, the test current $i_{test}$ flows through the capacitor $C_{SM}$, the first switch $S_{LT}$, the inductor $L_I$ and the fourth switch $S_{RB}$. At this time, the test current $i_{test}$ increases with lapse of time as follows.

$$i_{test}=i_{test}(t_4)+(-V_{SM})/L_I \times t \qquad \text{Equation 7}$$

Accordingly, according to Equation 7, the test current $i_{test}$ may decrease from the test current value $i_{test}(t_4)$ of the end time t4 of Mode 4.

Mode 6 (t5≤t<t6)

In Mode 5, as shown in FIG. 6, the fourth switch $S_{RB}$ may be maintained in the ON state and the first switch $S_{LT}$ may be turned off again. In this case, since the charging voltage $V_{SM}$ of the capacitor $C_{SM}$ cannot be applied to the inductor $L_I$ through the first switch $S_{LT}$, the test current $i_{test}$ does not increase. That is, the voltage applied to the inductor $L_I$ is 0 (zero).

The test current $i_{test}$ flows through the second diode $D_{LB}$, the inductor $L_I$ and the fourth switch $S_{RB}$ as shown in FIG. 8B. Accordingly, the test current $i_{test}$ may be expressed as follows.

$$i_{test}=i_{test}(t_5)=i_{test}(t_6) \qquad \text{Equation 8}$$

Accordingly, according to Equation 8, the test current $i_{test}$ may be equally maintained at a fifth time t5 and a sixth time t6. Therefore, it can be seen that the test current $i_{test}$ of Mode 6 is equal to the test current $i_{test}(t_5)$ of the end time t5 of Mode 5.

Mode 7 (t6≤t<t7)

In Mode 7, as shown in FIG. 6, the second switch $S_{LB}$ and the third switch $S_{RT}$ may be turned on and the first switch $S_{LT}$ and the fourth switch $S_{RB}$ may be turned off. In this case, currents $i_{SLB}$ and $i_{SRT}$ may flow through the second switch $S_{LB}$ and the third switch $S_{RT}$. As a result, as shown in FIG. 8C, the test current $i_{test}$ flows through the capacitor $C_{SM}$, the second diode $D_{LB}$, the inductor $L_I$ and the third diode $D_{RT}$. At this time, the test current $i_{test}$ increases with lapse of time as follows.

$$i_{test}=i_{test}(t_6)+V_{SM} \times t \qquad \text{Equation 9}$$

Accordingly, according to Equation 9, the test current $i_{test}$ may increase. Such test current $i_{test}$ may increase until the second switch $S_{LB}$ or the third switch $S_{RT}$ is turned off.

Mode 8 (t7≤t<t8)

In Mode 8, as shown in FIG. 6, the second switch $S_{LB}$ and the third switch $S_{RT}$ may be turned off and the fourth switch $S_{RB}$ may be turned on. In this case, since the charging voltage $V_{SM}$ of the capacitor $C_{SM}$ cannot be applied to the inductor $L_I$, the test current $i_{test}$ does not increase. That is. The voltage applied to the inductor $L_I$ is 0 (zero).

The test current $i_{test}$ flows through the second diode $D_{LB}$, the inductor $L_I$ and the fourth switch $S_{RB}$ as shown in FIG. 8B. Accordingly, the test current $i_{test}$ may be expressed as follows.

$$i_{test}=i_{test}(t_7)=i_{test}(t_8) \qquad \text{Equation 10}$$

Accordingly, according to Equation 10, the test current $i_{test}$ may be equally maintained at a seventh time t7 and an eighth time t8. Therefore, it can be seen that the test current $i_{test}$ of Mode 8 is equal to the test current $i_{test}(t_7)$ of the end time t7 of Mode 7.

Mode 9 (t8≤t<t9)

In Mode 9, as shown in FIG. 6, the second switch $S_{LB}$ and the third switch $S_{RT}$ are turned on again and the fourth switch $S_{RB}$ may be turned off. In this case, the charging voltage $V_{SM}$ of the capacitor $C_{SM}$ is applied to the inductor $L_I$ through the second switch $S_{LB}$ and the third switch $S_{RT}$, the test current $i_{test}$ may increase.

As shown in FIG. 8C, the test current $i_{test}$ flows through the capacitor $C_{SM}$, the second diode $D_{LB}$, the inductor $L_I$ and the third diode $D_{RT}$ as shown in FIG. 8C. At this time, the test current $i_{test}$ increases with lapse of time as follows.

$$i_{test}=i_{test}(t_8)+V_{SM}/L_I \times t \qquad \text{Equation 11}$$

Accordingly, according to Equation 11, the test current $i_{test}$ may increase. That is, the test current $i_{test}$ of Mode 9 may increase as compared to the test current at the end time t8 of Mode 8. Such test current $i_{test}$ may increase until the second switch $S_{LB}$ or the third switch $S_{RT}$ is turned off.

Mode 10 (t9≤t<t10)

In Mode 10, as shown in FIG. 6, the second switch $S_{LB}$ and the third switch $S_{RT}$ may be turned off again and the fourth switch $S_{RB}$ may be turned on again. In this case, since the charging voltage $V_{SM}$ of the capacitor $C_{SM}$ cannot be applied to the inductor $L_I$, the test current $i_{test}$ does not increase. That is, the voltage applied to the inductor $L_I$ is 0 (zero).

The test current $i_{test}$ flows through the second diode $D_{LB}$, the inductor $L_I$ and the fourth switch $S_{RB}$ as shown in FIG. 8B. Accordingly, the test current $i_{test}$ may be expressed as follows.

$$i_{test}=i_{test}(t_9)=i_{test}(t_{10}) \qquad \text{Equation 12}$$

Accordingly, according to Equation 12, the test current $i_{test}$ may be equally maintained at a ninth time t9 and a tenth time t10. Therefore, it can be seen that the test current $i_{test}$ of Mode 10 is equal to the test current $i_{test}(t_9)$ of the end time t9 of Mode 9.

Mode 11 (t10≤t<t11)

In Mode 11, as shown in FIG. 6, the second switch $S_{LB}$ and the third switch $S_{RT}$ are turned on again and the fourth switch $S_{RB}$ may be turned off. In this case, since the charging voltage $V_{SM}$ of the capacitor $C_{SM}$ is applied to the inductor $L_I$ through the second switch $S_{LB}$ and the third switch $S_{RT}$, the test current $i_{test}$ may increase.

As shown in FIG. 8C, the test current $i_{test}$ flows through the capacitor $C_{SM}$, the second diode $D_{LB}$, the inductor $L_I$ and the third diode $D_{RT}$. At this time, the test current $i_{test}$ may increase with lapse of time as follows.

$$i_{test}=i_{test}(t_{10})+V_{SM}/L_I \times t \qquad \text{Equation 13}$$

Accordingly, according to Equation 13, the test current $i_{test}$ may increase. That is, the test current $i_{test}$ of Mode 11 may increase as compared to the test current at the end time t10 of Mode 10. Such test current $i_{test}$ may increase until the second switch $S_{LB}$ or the third switch $S_{RT}$ is turned off.

The test current $i_{test}$ of the end time t11 of Mode 11 may become 0 (zero).

Mode 12 (t11≤t<t12)

In Mode 12, as shown in FIG. 6, the second switch $S_{LB}$ and the third switch $S_{RT}$ are maintained in the ON state as in Mode 11 and the fourth switch $S_{RB}$ may be in the OFF state as in Mode 11. Accordingly, since the charging voltage $V_{SM}$ of the capacitor $C_{SM}$ is applied to the inductor $L_I$ through the second switch $S_{LB}$ and the third switch $S_{RT}$, the test current $i_{test}$ may increase.

The test current $i_{test}$ may increase from a negative value to 0 (zero) in Mode 11 and the test current $i_{test}$ may increase from 0 (zero) in Mode 12. Accordingly, the test current $i_{test}$ of Mode 12 flows in a direction opposite to that of the test current of Mode 11. That is, as shown in FIG. 8D, the test current $i_{test}$ flows through the capacitor $C_{SM}$, the third switch $S_{RT}$, the inductor $L_I$ and the second switch $S_{LB}$.

The test current $i_{test}$ may increase with lapse of time as follows.

$$i_{test}=i_{test}(t_{11})+V_{SM}/L_I \times t \qquad \text{Equation 14}$$

where, since $i_{test}(t_{11})$ is 0 (zero), the test current $i_{test}$ may increase from 0 (zero). Such test current $i_{test}$ may increase until the second switch $S_{LB}$ or the third switch $S_{RT}$ is turned off.

Mode 13 (t12≤t<t13)

In Mode 13, as shown in FIG. 6, the third switch $S_{RT}$ may be maintained in the ON state and the second switch $S_{LB}$ may be turned off. In this case, since the charging voltage $V_{SM}$ of the capacitor $C_{SM}$ cannot be applied through the second switch $S_{LB}$, the test current $i_{test}$ no longer increases and the test current $i_{test}$ of Mode 12 may be maintained. That is, the voltage applied to the inductor $L_I$ is 0 (zero). At this time, the test current $i_{test}$ flows through the third switch $S_{RT}$, the inductor $L_I$ and the first diode $D_{LT}$ as shown in FIG. 8E. Accordingly, the test current $i_{test}$ may be expressed as follows.

$$i_{test}=i_{test}(t_{12})=i_{test}(t_{13}) \qquad \text{Equation 15}$$

Accordingly, according to Equation 15, the test current $i_{test}$ may be equally maintained at a twelfth time t12 and a thirteenth time t13. Therefore, it can be seen that the test current $i_{test}$ of Mode 13 is equal to the test current $i_{test}(t_{12})$ of the end time t12 of Mode 12.

Mode 14 (t13≤t<t14)

In Mode 14, as shown in FIG. 6, the second switch $S_{LB}$ may be turned on again and the fourth switch $S_{RB}$ may be turned off. Accordingly, since the charging voltage $V_{SM}$ of the capacitor $C_{SM}$ is applied to the inductor $L_I$ through the second switch $S_{LB}$ and the third $S_{RT}$, the test current $i_{test}$ may increase.

The test current $i_{test}$ flows through the capacitor $C_{SM}$, the third switch $S_{RT}$, the inductor $L_I$) and the second switch $S_{LB}$ as shown in FIG. 8D.

The test current $i_{test}$ may increase with lapse of time as follows.

$$i_{test}=i_{test}(t_{13})+V_{SM}/L_I \times t \qquad \text{Equation 16}$$

Accordingly, according to Equation 16, the test current $i_{test}$ may increase. That is, the test current $i_{test}$ of Mode 14 may increase as compared to the test current at the end time t13 of Mode 13. Such test current $i_{test}$ may increase until the second switch $S_{LB}$ or the third switch $S_{RT}$ is turned off.

Mode 15 (t14≤t<t15)

In Mode 15, as shown in FIG. 6, the third switch $S_{RT}$ may be maintained in the ON state and the second switch $S_{LB}$ may be turned off. In this case, since the charging voltage $V_{SM}$ of the capacitor $C_{SM}$ cannot be applied through the second switch $S_{LB}$, the test current $i_{test}$ no longer increases and the test current $i_{test}$ of Mode 14 may be maintained. That is, the voltage applied to the inductor $L_I$ is 0 (zero). At this time, the test current $i_{test}$ flows through the third switch $S_{RT}$, the inductor $L_I$ and the first diode $D_{LT}$ as shown in FIG. 8E. Accordingly, the test current $i_{test}$ may be expressed as follows.

$$i_{test}=i_{test}(t_{14})=i_{test}(t_{15}) \qquad \text{Equation 17}$$

Accordingly, according to Equation 17, the test current $i_{test}$ may be equally maintained at a fourteenth time t14 and a fifteenth time t15. Therefore, it can be seen that the test current $i_{test}$ of Mode 15 is equal to the test current $i_{test}(t_{14})$ of the end time t14 of Mode 14.

Mode 16 (t15≤t<t16)

In Mode 16, as shown in FIG. 6, the second switch $S_{LB}$ may be turned on again and the fourth switch $S_{RB}$ may be turned off. Accordingly, since the charging voltage $V_{SM}$ of the capacitor $C_{SM}$ is applied to the inductor $L_I$ through the second switch $S_{LB}$ and the third switch $S_{RT}$, the test current $i_{test}$ may increase.

The test current $i_{test}$ flows through the capacitor $C_{SM}$, the third switch $S_{RT}$, the inductor $L_I$ and the second switch $S_{LB}$ as shown in FIG. 8D.

The test current $i_{test}$ may increase with lapse of time as follows.

$$i_{test}=i_{test}(t_{15})+V_{SM}/L_I \times t \qquad \text{Equation 18}$$

Accordingly, according to Equation 18, the test current $i_{test}$ may increase. That is, the test current $i_{test}$ of Mode 16 may increase as compared to the test current at the end time t15 of Mode 15. Such test current $i_{test}$ may increase until the second switch $S_{LB}$ or the third switch $S_{RT}$ is turned off.

Mode 17 (t16≤t<t17)

In Mode 17, as shown in FIG. 6, the third switch $S_{RT}$ may be maintained in the ON state and the second switch $S_{LB}$ may be turned off. In this case, since the charging voltage $V_{SM}$ of the capacitor $C_{SM}$ cannot be applied through the second switch $S_{LB}$, the test current test no longer increases and the test current $i_{test}$ of Mode 16 may be maintained. That is, the voltage applied to the inductor $L_I$ is 0 (zero). At this time, the test current $i_{test}$ flows through the third switch $S_{RT}$, the inductor $L_I$ and the first diode $D_{LT}$ as shown in FIG. 8E. Accordingly, the test current $i_{test}$ may be expressed as follows.

$$i_{test}=i_{test}(t_{16})=i_{test}(t_{17}) \qquad \text{Equation 19}$$

Accordingly, according to Equation 19, the test current $i_{test}$ may be equally maintained at a sixteenth time t16 and a seventeenth time t17. Therefore, it can be seen that the test current $i_{test}$ of Mode 17 is equal to the test current $i_{test}(t_{16})$ of the end time t16 of Mode 16.

Mode 18 (t17≤t<t18)

In Mode 18, as shown in FIG. 6, the first switch $S_{LT}$ and the fourth switch $S_{RB}$ may be turned on and the second switch $S_{LB}$ and the third switch $S_{RT}$ may be turned off. In this case, since the charging voltage $V_{SM}$ of the capacitor $C_{SM}$ is applied to the inductor $L_I$ through the first switch $S_{LT}$ and the fourth switch $S_{RB}$, the test current $i_{test}$ may decrease.

The test current $i_{test}$ flows through the capacitor $C_{SM}$, the fourth diode $D_{RB}$, the inductor $L_I$ and the first diode $D_{LT}$ as shown in FIG. 8F.

At this time, the test current $i_{test}$ may be expressed as follows.

$$i_{test}=i_{test}(t_{17})+(-V_{SM})/L_I \times t \qquad \text{Equation 20}$$

Accordingly, according to Equation 20, the test current $i_{test}$ may decrease. That is, the test current $i_{test}$ of Mode 18 may decrease as compared to the test current at the end time t17 of Mode 17. Such test current $i_{test}$ may decrease until the first switch $S_{LT}$ or the fourth switch $S_{RB}$ is turned off.

Mode 19 (t18≤t<t19)

In Mode 19, as shown in FIG. 6, the third switch $S_{RT}$ may be turned on and the first switch $S_{LT}$ and the fourth switch $S_{RB}$ may be turned off. In this case, since the charging voltage $V_{SM}$ of the capacitor $C_{SM}$ is not applied to the inductor $L_I$ through the fourth switch $S_{RB}$, the test current $i_{test}$ no longer decreases.

The test current $i_{test}$ flows through the third switch $S_{RT}$, the inductor $L_I$ and the first diode $D_{LT}$ as shown in FIG. 8E.

The test current $i_{test}$ may be expressed as follows.

$$i_{test}=i_{test}(t_{18})=i_{test}(t_{19}) \quad \text{Equation 21}$$

Accordingly, according to Equation 21, the test current $i_{test}$ may be equally maintained at an eighteenth time t18 and a nineteenth time t19. Therefore, it can be seen that the test current $i_{test}$ of Mode 19 is equal to the test current $i_{test}(t_{18})$ of the end time t18 of Mode 18.

Mode 20 (t19≤t<t20)

In Mode 20, as shown in FIG. 6, the third switch $S_{RT}$ may be turned off and the first switch $S_{LT}$ and the fourth switch $S_{RB}$ may be turned on. In this case, since the charging voltage $V_{SM}$ of the capacitor $C_{SM}$ is applied to the inductor $L_I$ through the first switch $S_{LT}$ and the fourth switch $S_{RB}$, the test current may decrease.

The test current $i_{test}$ flows through the capacitor $C_{SM}$, the fourth diode $D_{RB}$, the inductor $L_I$ and the first diode $D_{LT}$ as shown in FIG. 8F.

At this time, the test current $i_{test}$ may be expressed as follows.

$$i_{test}=i_{test}(t_{19})+(-V_{SM})/L_I \times t \quad \text{Equation 22}$$

Accordingly, according to Equation 22, the test current $i_{test}$ may decrease. That is, the test current $i_{test}$ of Mode 20 may decrease as compared to the test current at the end time t19 of Mode 19. Such test current $i_{test}$ may decrease until the first switch $S_{LT}$ or the fourth switch $S_{RB}$ is turned off.

Mode 21 (t20≤t<t21)

In Mode 21, as shown in FIG. 6, the third switch $S_{RT}$ may be turned on again and the first switch $S_{LT}$ and the fourth switch $S_{RB}$ may be turned off. In this case, since the charging voltage $V_{SM}$ of the capacitor $C_{SM}$ is not applied to the inductor $L_I$ through the fourth switch $S_{RB}$, the test current $i_{test}$ no longer decreases.

The test current $i_{test}$ flows through the third switch $S_{RT}$, the inductor $L_I$ and the first diode $D_{LT}$ as shown in FIG. 8E.

At this time, the test current $i_{test}$ may be expressed as follows.

$$i_{test}=i_{test}(t_{20})=i_{test}(t_{21}) \quad \text{Equation 23}$$

Accordingly, according to Equation 23, the test current $i_{test}$ may be equally maintained at a twentieth time t20 and a twenty-first time t21. Therefore, the test current $i_{test}$ of Mode 21 is equal to the test current $i_{test}(t_{20})$ of the end time of Mode 20.

Mode 22 (t21≤t<t22)

In Mode 22, as shown in FIG. 6, the third switch $S_{RT}$ may be turned off and the first switch $S_{LT}$ and the fourth switch $S_{RB}$ may be turned on again. In this case, since the charging voltage $V_{SM}$ of the capacitor $C_{SM}$ is applied to the inductor $L_I$ through the first switch $S_{LT}$ and the fourth switch $S_{RB}$, the test current $i_{test}$ may decrease.

The test current $i_{test}$ flows through the capacitor $C_{SM}$, the fourth diode $D_{RB}$, the inductor $L_I$ and the first diode $D_{LT}$ as shown in FIG. 8F.

At this time, the test current $i_{test}$ may be expressed as follows.

$$i_{test}=i_{test}(t_{21})+(-V_{SM})/L_I \times t \quad \text{Equation 24}$$

Accordingly, according to Equation 24, the test current $i_{test}$ may decrease. That is, the test current $i_{test}$ of Mode 22 may decrease as compared to the test current at the end time t21 of Mode 21. Such test current $i_{test}$ may decrease until the first switch $S_{LT}$ or the fourth switch $S_{RB}$ is turned off.

The test current $i_{test}$ at the end time t22 of Mode 22 may be 0 (zero).

The AC test current $i_{test}$ of one period may be generated by operation of Mode 1 to Mode 22.

When operation of Mode 22 is completed, the AC test current of a next period may be generated by operation of Mode 1 to Mode 22. The test current $i_{test}$ may be periodically generated for 30 minutes or more, for example. The test current $i_{test}$ may be periodically generated during a predetermined time and the submodule performance test of the first to fourth switches $S_{LT}$, $S_{LB}$, $S_{RT}$ and $S_{RB}$, the first to fourth diodes DLT, DLB, DRT and DRB, and the capacitor $C_{SM}$ of the submodule 72 may be performed using the generated test current $i_{test}$.

By the submodule performance test of the first to fourth switches $S_{LT}$, $S_{LB}$, $S_{RT}$ and $S_{RB}$, the first to fourth diodes $D_{LT}$, $D_{LB}$, $D_{RT}$ and $D_{RB}$ and the capacitor $C_{SM}$ of the submodule 72, whether the first to fourth switches $S_{LT}$, $S_{LB}$, $S_{RT}$ and $S_{RB}$, the first to fourth diodes $D_{LT}$, $D_{LB}$, $D_{RT}$ and $D_{RB}$ and the capacitor $C_{SM}$ of the submodule 72 may be mounted in the power converter 53 of the MMC based STATCOM may be determined.

Although the test of the submodule performance using the test current $i_{test}$ based on the rated voltage has been described up to now, the test of the submodule performance using the test current $i_{test}$ based on a low voltage is possible. In this case, by closing the switch 82 of the test current adjuster 80, the test current $i_{test}$ may be generated using the first inductor $L_{I1}$ only, without using the second inductor $L_{I2}$. By using the first inductor $L_{I1}$ only, the test of the submodule performance using the test current $i_{test}$ generated based on the low voltage of the capacitor $C_{SM}$ may be performed.

<Compensation for Loss During the Test of the Submodule Performance>

A method of compensating for loss occurring during the test of the submodule performance will be described with reference to FIGS. 9 and 10.

Figure 9:
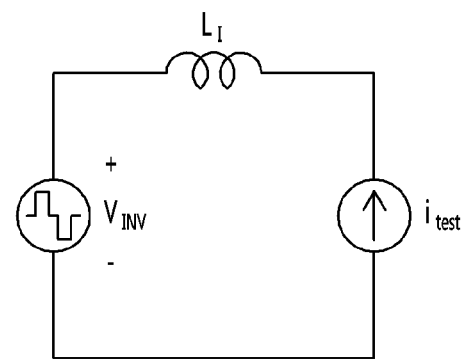
FIG. 9 is a diagram showing an equivalent circuit for loss compensation in a synthetic test circuit for testing a submodule performance in a power compensator according to the present invention.

FIG. 9 is a diagram showing an equivalent circuit for loss compensation in a synthetic test circuit for testing a submodule performance in a power compensator according to the present invention. FIG. 10 is a waveform diagram of test current and an output voltage upon loss compensation.

When the test of the submodule performance is performed using the test current $i_{test}$ for a long period of time, loss of the test current $i_{test}$ may occur. Accordingly, it is necessary to compensate for loss of such test current $i_{test}$ for an optimal submodule performance test.

As shown in FIG. 9, when the submodule 72 operates by the charging voltage $V_{SM}$ of the capacitor $C_{SM}$, the test current $i_{test}$ may be generated. When the test current $i_{test}$ is generated, loss may occur in the test current $i_{test}$ by the elements, for example, the first to fourth switches $S_{LT}$, $S_{LB}$, $S_{RT}$ and $S_{RB}$, the first to fourth diodes $D_{LT}$, $D_{LB}$, $D_{RT}$ and $D_{RB}$ and the capacitor $C_{SM}$ of the submodule 72.

Figure 10:
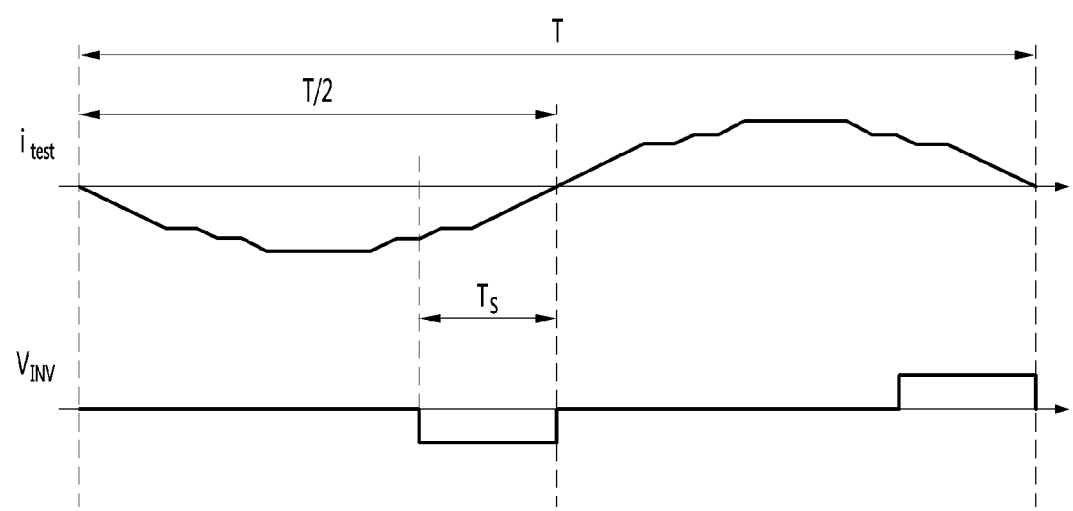
FIG. 10 is a waveform diagram of test current and an output voltage upon loss compensation.

In this case, as shown in FIG. 10, loss may be compensated for by the output voltage $V_{INV}$ output from the loss compensator 66 of the current source 60.

The test current $i_{test}$ may be generated with a period T. In this case, the output voltage $V_{INV}$ mat be supplied from the loss compensator 66 of the current source 60 during a partial period Ts of the half period T/2 of the test current $i_{test}$.

Accordingly, loss of the test current $i_{test}$ may be compensated for in half period units without being limited thereto.

In this case, the average output power $<P_{INV}>$ of the current source 60 may be expressed as follows.

$$<P_{INV}>=1/T \times \int^{Ts}(i_{test}(t) \times V_{INV}(t))dt \quad \text{Equation 25}$$

Ts is an integral period, in which a loss compensation component is provided, and may be (T/2−Ts) to T/2 or (T−Ts) to T, without being limited thereto.

Ts may be changed according to the loss degree of the test current $i_{test}$. For example, if the loss of the test current $i_{test}$ is large, Ts may increase, without being limited thereto.

In addition, the output voltage $V^{INV}$ output from the loss compensator 66 of the current source 60, that is, the loss compensation component, may be changed according to the loss degree of the test current $i_{test}$. For example, if loss of the test current $i_{test}$ is large, the loss compensation component $V_{INV}$ output from the loss compensator 66 of the current source 60 may increase, without being limited thereto.

The synthetic test circuit for testing the submodule performance in the power compensator and the test method thereof according to the present invention has the following effects.

According to at least one of the embodiments of the present invention, if the charging voltage having the capacity set in the submodule test unit which is an object of testing is stored, it is possible to test the submodule performance using the charging voltage. Therefore, it is possible to test the submodule performance of the submodule test unit requiring large power using a small apparatus and at low cost. Accordingly, economic efficiency is excellent.

According to at least one of the embodiments of the present invention, since the test of the submodule performance is performed using a submodule test unit including only three submodules decided in the international standard, without using all of submodules included in the MMC based power compensator, it is possible to obtain the same effects as the case of using the plurality of submodules included in the MMC based power compensator According to at least one of the embodiments of the present invention, if loss occurs in a test current, loss may be compensated for by a loss compensation component, thereby testing the submodule performance without error.

The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

What is claimed is:

1. A synthetic test circuit for testing a submodule performance in a power compensator, comprising:
   a submodule test unit which includes a capacitor and is an object of testing the submodule performance;
   a current source connected to the submodule test unit to supply a voltage to the capacitor of the submodule test unit such that a preset charging voltage is stored in the capacitor in order to operate the submodule test unit; and
   a controller configured to test the submodule performance of the submodule test unit using the stored preset charging voltage,
   wherein the submodule test unit is configured to store the voltage supplied by the current source in the capacitor as the preset charging voltage before the test of the submodule performance, and generate a test current using the preset charging voltage stored in the capacitor, and
   wherein, if loss is generated in the test current during the test of the submodule performance, the current source supplies an extra voltage to the submodule test unit.

2. The synthetic test circuit according to claim 1, further comprising:
   a test current adjuster connected between the current source and the submodule test unit to adjust the test current.

3. The synthetic test circuit according to claim 2, wherein the test current adjuster includes:
   a first inductor connected between the current source and the submodule test unit;
   a second inductor connected to the first inductor in series; and
   a switch connected to the second inductor in parallel.

4. The synthetic test circuit according to claim 3,
   wherein, when the switch is opened, the submodule performance test of a rated voltage is performed, and
   wherein, when the switch is closed, the submodule performance test of a low voltage is performed.

5. The synthetic test circuit according to claim 1,
   wherein the submodule test unit includes at least one or more submodules connected to each other in series, each of the submodules includes:
   a switching unit including first to fourth switches controlled by the controller and first to fourth diodes respectively connected to the first to fourth switches in antiparallel; and
   a capacitor connected to the switching unit.

6. The synthetic test circuit according to claim 5,
   wherein the switching unit includes:
   a first switch pair connected between first and fourth nodes; and
   a second switch pair connected to the first switch pair in parallel between the first and fourth nodes,
   wherein the first switch pair includes:
   the first switch connected between the first node and a second node; and
   the second switch connected between the second node and the fourth node,
   wherein the second switch pair includes:
   the third switch connected between the first node and a third node; and
   the fourth switch connected between the third node and the fourth node, and
   wherein the capacitor is connected between the first node and the fourth node.

7. The synthetic test circuit according to claim 6, wherein the controller controls switching of the first to fourth switches to generate the test current using the preset charging voltage stored in the capacitor, during the test of the submodule performance.

8. The synthetic test circuit according to claim 7, wherein the controller controls switching of the first to fourth switches such that the test current has an alternating current (AC) waveform.

9. The synthetic test circuit according to claim 1, wherein the current source includes:
   a rectifier configured to rectify a three-phase AC voltage to a DC voltage;
   a ripple remover configured to remove ripple included in the DC voltage; and a loss compensator configured to supply a loss compensation component for compensating for loss which occurs in the test current during the test of the submodule performance.

10. The synthetic test circuit according to claim 9, wherein the loss compensator is an inverter.

11. The synthetic test circuit according to claim 9, wherein average output power of the current source is expressed by the following equation:

$$<P_{INV}> = 1/T \times \int^{Ts}(i_{test}(t) \times V_{INV}(t))dt$$

where, Ts denotes an integral period in which the loss compensation component is provided, $i_{test}$ denotes the test current and an output voltage $V_{INV}$ denotes the loss compensator component of the loss compensator.

12. The synthetic test circuit according to claim 11, wherein the integral period is (T/2−Ts) to T/2 or (T−Ts) to T (T being a period of the test current).

13. A test method of a synthetic test circuit for testing a submodule performance in a power compensator including a submodule test unit which includes a capacitor and is an object of testing the submodule performance, a current source connected to the submodule test unit and a controller, the test method comprising:
   supplying, by the current source, a voltage to the capacitor of the submodule test unit such that a preset charging voltage is stored in the capacitor in order to operate the submodule test unit;
   storing, by the submodule test unit, the voltage supplied by the current source in the capacitor as the preset charging voltage before the test of the submodule performance;
   operating, by the controller, the submodule test unit using the stored preset charging voltage;
   generating, by the submodule test unit, a test current based on the preset charging voltage stored in the capacitor;
   testing, by the controller, the submodule performance using the test current; and
   if loss is generated in the test current during the test of the submodule performance, supplying, by the current source, an extra voltage to the submodule test unit.

14. The test method according to claim 13, wherein the synthetic test circuit for testing the submodule performance in the power compensator further includes a test current adjuster connected between the current source and the submodule test unit, wherein the test current adjuster includes:
   a first inductor connected between the current source and the submodule test unit;
   a second inductor connected to the first inductor in series; and
   a switch connected to the second inductor in parallel, wherein the test method further comprises:
   opening the switch to perform the submodule performance test of a rated voltage; and
   closing the switch to perform the submodule performance test of a low voltage.

15. The test method according to claim 13, wherein the supplying the extra voltage further comprises:
   generating a loss compensation component for compensating for loss in the current source if loss occurs in the test current during the test of the submodule performance of the submodule test unit,
   wherein the loss compensation component is an output voltage output from the current source during a predetermined portion of a half period of the test current.

* * * * *